US008030184B2

(12) United States Patent
Adachi et al.

(10) Patent No.: US 8,030,184 B2
(45) Date of Patent: Oct. 4, 2011

(54) EPITAXIAL WAFER AND METHOD OF PRODUCING THE SAME

(75) Inventors: Naoshi Adachi, Tokyo (JP); Tamio Motoyama, Tokyo (JP)

(73) Assignee: Sumco Corporation, Tokyo (JP)

( * ) Notice: Subject to any disclaimer, the term of this patent is extended or adjusted under 35 U.S.C. 154(b) by 74 days.

(21) Appl. No.: 12/334,150

(22) Filed: Dec. 12, 2008

(65) Prior Publication Data

US 2009/0152685 A1 Jun. 18, 2009

(30) Foreign Application Priority Data

Dec. 13, 2007 (JP) ................................. 2007-322504
Dec. 9, 2008 (JP) ................................. 2008-312850

(51) Int. Cl.
*H01L 21/322* (2006.01)

(52) U.S. Cl. . 438/476; 438/473; 438/761; 257/E21.054; 257/E21.318; 257/E21.461

(58) Field of Classification Search .................... 438/58, 438/143, 310, 471, 473, 476, 477, 931, FOR. 144, 438/FOR. 260, 761; 257/E21.054, E21.318, 257/E21.461
See application file for complete search history.

(56) References Cited

U.S. PATENT DOCUMENTS

| 3,512,056 A * | 5/1970 | Chu Ting Li et al. ......... 257/578 |
| 3,648,123 A * | 3/1972 | Ernick et al. .................. 257/586 |
| 2006/0175613 A1* | 8/2006 | Lee et al. ....................... 257/65 |
| 2007/0020893 A1 | 1/2007 | Ueno et al. |

FOREIGN PATENT DOCUMENTS

| DE | 102006005875 A1 | 8/2006 |
| JP | 2000-216168 | * 4/2000 |

OTHER PUBLICATIONS

German Office Actions corresponding to Application No. 10 2008 062 040.8-43, dated Mar. 14, 2011, English language translation.

* cited by examiner

*Primary Examiner* — Matthew Smith
*Assistant Examiner* — Quovaunda V Jefferson
(74) *Attorney, Agent, or Firm* — Sughrue Mion, PLLC

(57) ABSTRACT

An epitaxial wafer comprises a silicon substrate, a gettering epitaxial film formed thereon and containing silicon and carbon, and a main silicon epitaxial film formed on the gettering epitaxial film, in which the gettering epitaxial film has a given carbon atom concentration and carbon atoms are existent between its silicon lattices.

8 Claims, 3 Drawing Sheets

EPITAXIAL WAFER AND METHOD OF PRODUCING THE SAME

BACKGROUND OF THE INVENTION

1. Field of the Invention

This invention relates to an epitaxial wafer and a method of producing the same, and more particularly to an epitaxial wafer having a given gettering means suitable for an imaging device or a thin film device and a method of producing the same.

2. Description of the Related Art

As a problem in a semiconductor process is mentioned an incorporation of a heavy metal as an impurity into a silicon wafer. If the heavy metal is incorporated, it remarkably exerts adverse influences on device characteristics such as poor pose time, poor retention, poor junction leak, insulation breakage of oxide film and the like. Therefore, it is common to adopt a gettering method for suppressing the diffusion of the heavy metal into a device forming (active) region at a front surface side of the silicon wafer.

As the conventional gettering method are known an intrinsic gettering method (IG method) utilizing micro defects inside the silicon wafer as a gettering site (capture region) and an extrinsic gettering method (EG method) wherein mechanical strain is given to a surface (rear surface of the wafer opposite to the device forming surface by a sand blast process or the like or a polycrystalline silicon film is formed on the rear surface as a gettering site.

With the advance of techniques for electronic devices such as mobile phones, digital still cameras and the like, it is extending to thin the thickness of semiconductor device to be built into these electronic devices. As a result, it is demanded to develop silicon wafers in which the aforementioned gettering site is existent in a region closer to the device active layer for obtaining a high gettering ability.

However, even when the silicon wafer having the gettering site closer to the device active layer is formed by the IG method as compared with the EG method, a DZ layer having no oxygen precipitation nucleus may be formed in a region ranging from the surface of the wafer to not less than 10 μm by the heat treatment. The final thickness of the semiconductor device tends to be more thinned and will be anticipated to be about 10 μm in the year of 2010 or later. In this case, the gettering region is not existent in the wafer, so that metal impurities generated at the device step can not be gettered fully. As the impurities generated in the device active layer can not be gettered sufficiently, the IG and EG methods can not be applied to the thinned device as they are.

As the silicon wafer having the gettering site closer to the device active layer is mentioned a silicon wafer as described in JP-A-H05-152304 wherein carbon ions are implanted into a surface of a silicon wafer to form a gettering layer at a shallow position from the surface and then an epitaxial layer is grown on such an surface of the wafer. Also, there is mentioned a silicon wafer as described in JP-A-2006-216934 wherein a gettering layer containing C, Ge, Sn and/or Pb is formed by CVD method or a doping method and then an epitaxial layer is formed on the gettering layer.

In the silicon wafer produced by the method described in JP-A-H05-152304, however, it is required to use a very expensive ion implantation apparatus, and also there are problems such as metal contamination, generation of particles and the like due to the ion implantation through the ion implantation apparatus itself, as well as occurrence of defects induced in a finished epitaxial film due to the particles. In the silicon wafer produced by the method described in JP-A-2006-216934, the gettering effect is developed through a lattice stress effect introducing carbon into lattice positions, so that it is required to forming the gettering layer at a low temperature within a temperature range of 500-750° C. for introducing carbon into the lattice positions and hence the layer forming rate is largely lowered, which is unsuitable in the mass production. Since all of these silicon wafers in these patent documents are produced at the low temperature growing method, there is a problem such as the deterioration of quality due to defects, haze and the like of the device active layer as a final epitaxial film.

SUMMARY OF THE INVENTION

It is, therefore, an object of the invention to provide an epitaxial wafer having a gettering layer with a high gettering ability without adversely influencing on the quality of a device active layer even when the gettering layer is formed in the vicinity of the device active layer as well as a method of producing the same.

In order to achieve the above object, the summary and construction of the invention are as follows:

(1) An epitaxial wafer comprising a silicon substrate, a gettering epitaxial film formed thereon and containing silicon and carbon, and a main silicon epitaxial film formed on the gettering epitaxial film, in which the gettering epitaxial film has a carbon atom concentration of not less than $50 \times 10^{17}$ atoms/cm$^3$ but not more than $1.0 \times 10^{21}$ atoms/cm$^3$ and carbon atoms are existent between its silicon lattices.

(2) An epitaxial wafer according to the item (1), wherein the gettering epitaxial film has a thickness of 0.025-5 μm.

(3) An epitaxial wafer according to the item (1), wherein a silicon epitaxial undercoat is formed on the silicon substrate.

(4) An epitaxial wafer according to the item (1), wherein a capping silicon film is formed on the gettering epitaxial film.

(5) An epitaxial wafer according to the item (1), wherein at least one of the silicon epitaxial undercoat, the gettering epitaxial film and the capping silicon film is a low resistance film having a specific resistance of not more than 1Ω·cm.

(6) A method of producing an epitaxial wafer, which comprises a step of growing a gettering epitaxial film containing silicon and carbon on a silicon substrate in a mixed gas atmosphere containing silicon and carbon at a temperature of higher than 750° C. and a step of forming a main silicon epitaxial film on the gettering epitaxial film, in which a carbon atom concentration in the gettering epitaxial film is made to not less than $50 \times 10^{17}$ atoms/cm$^3$ but not more than $1.0 \times 10^{21}$ atoms/cm$^3$ and carbon atoms are existent between silicon lattices.

(7) A method of producing an epitaxial wafer according to the item (6), wherein the gettering epitaxial film has a thickness of 0.025-5 μm.

(8) A method of producing an epitaxial wafer according to the item (6), which further comprises a step of growing a silicon epitaxial undercoat prior to the step of growing the gettering epitaxial film.

(9) A method of producing an epitaxial wafer according to the item (6), which further comprises a step of growing a capping silicon film between the step of growing the gettering epitaxial film and the step of growing the main silicon epitaxial film.

(10) A method of producing an epitaxial wafer according to the item (6), wherein at least one of the silicon epitaxial undercoat, the gettering epitaxial film and the capping silicon film is a low resistance film having a specific resistance of not more than 1Ω·cm.

According to the invention, there can be provided an epitaxial wafer having a gettering layer with a high gettering ability without adversely influencing on the quality of a device active layer even when the gettering layer is formed in the vicinity of the device active layer as well as a method of producing the same.

BRIEF DESCRIPTION ON THE DRAWINGS

The invention will be described with reference to the accompanying drawings, wherein.

DESCRIPTION OF THE PREFERRED EMBODIMENTS

Figure 1:
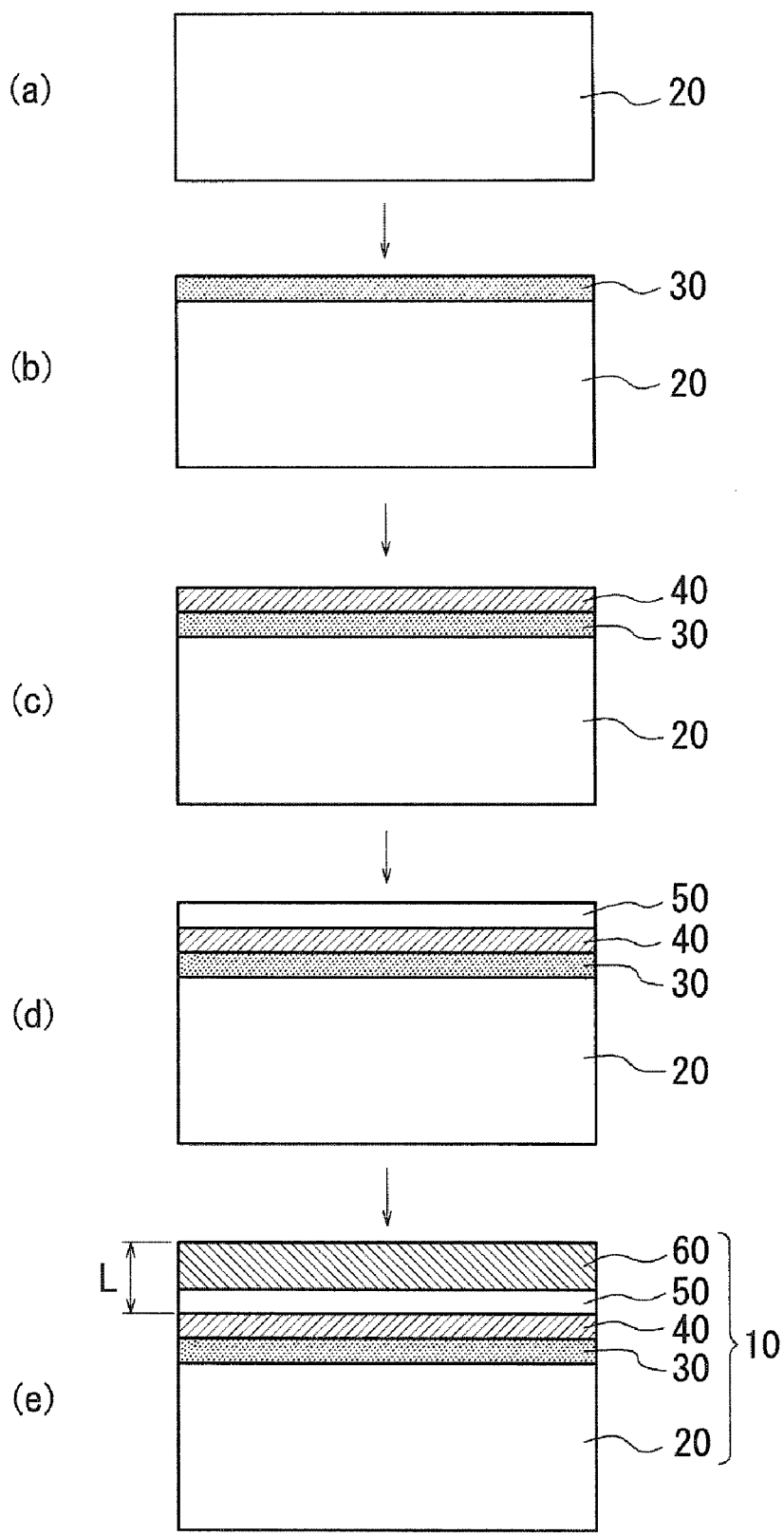
FIG. 1 is a flow chart illustrating production steps of an epitaxial wafer according to the invention.

As shown in FIG. 1, an epitaxial wafer 10 according to the invention is produced by forming a gettering epitaxial film 40 containing silicon and carbon (FIG. 1(c)) on a silicon substrate 20 (FIG. 1(a)) or a silicon epitaxial undercoat 30 (FIG. 1(b)) formed on the silicon substrate 20, if necessary, and forming a main silicon epitaxial film 60 (FIG. 1(e)) as a device active layer on the gettering epitaxial film 40 or a capping silicon film 50 (FIG. 1(d)) formed on the gettering epitaxial film 40, if necessary.

The inventors have made various studies on an epitaxial wafer having a gettering layer with a high gettering ability without adversely influencing on the quality of a device active layer even when the gettering layer is formed in the vicinity of the device active layer, and found that when the gettering epitaxial film 40 containing silicon and carbon is formed at a film forming temperature of higher than 750° C. between the silicon substrate 20 and the main silicon epitaxial film 60 and the carbon atom concentration in the gettering epitaxial film is made to not less than $5.0 \times 10^{17}$ atoms/cm$^3$ but not more than $1.0 \times 10^{21}$ atoms/cm$^3$, carbon atoms are introduced into positions between silicon lattices and also carbons existent in the lattices act as a gettering site in the vicinity of the main silicon epitaxial film 60. Further, it has been found that since the film growth can be carried out at a temperature higher than that of the conventional technique, it is possible to form the gettering epitaxial film 40 having a high crystallinity and a high quality without deteriorating the quality and the occurrence of defects such as haze, dislocation and the like resulting from the deterioration of the crystallinity in the gettering epitaxial film 40 can be suppressed by the main silicon epitaxial film 60 formed thereon. As a result, the invention has been accomplished.

The thickness of the gettering epitaxial film 40 is preferable to be 0.025-5 μm. When the thickness is less than 0.025 μm, there is a fear that the sufficient gettering ability can not be obtained, while when it exceeds 5 μm, the epitaxial growing time becomes long to bring about the lowering of the productivity.

As shown in FIG. 1(b), the silicon epitaxial undercoat 30 may be formed on the silicon substrate 20, if necessary. Since the silicon epitaxial undercoat 30 acts as a buffering layer, the formation of the undercoat 30 is an effective means for reducing the dislocation generated due to the difference of lattice constant between the substrate 20 and the main silicon epitaxial film 60.

As shown in FIG. 1(d), the capping silicon film 50 may be formed on the gettering epitaxial film 40, if necessary. Since the capping silicon film 50 serves as a cover to the main silicon epitaxial film 60, the formation of the film 50 is an effective means for further suppressing the diffusion of carbon atoms included in the gettering epitaxial film 40 into the main silicon epitaxial film 60.

When the epitaxial wafer is used for an imaging device, a specific resistance of the film located below the device active layer, preferably a specific resistance of a film located below a depletion layer is preferable to be not more than 1Ω·cm. Because, when the specific resistance of such a downside film is made low, electrons from a photodiode are rapidly escaped to improve the electron mobility and hence the device characteristics.

The production method of the epitaxial wafer 10 according to the invention will be described with reference to FIG. 1 below.

As shown in FIG. 1, the production method according to the invention comprises a step (FIG. 1(c)) of growing a gettering epitaxial film 40 containing silicon and carbon on a silicon substrate 20 (FIG. 1(a)) in a mixed gas atmosphere containing silicon and carbon at a predetermined temperature and a step (FIG. 1(e)) of forming a main silicon epitaxial film 60 on the gettering epitaxial film 40.

The growth step of the gettering epitaxial film according to the invention (FIG. 1(c)) is a step of growing the gettering epitaxial film 40 made of Si, C and O on the silicon substrate 20, which is necessary to be carried out in a mixed gas atmosphere containing silicon, carbon and oxygen at a temperature of higher than 750° C.

When the temperature exceeds 750° C., carbon atoms are introduced into positions between silicon lattices, and hence carbons existent in the positions between the lattices can be serves as a gettering site in the vicinity of the main silicon epitaxial film 60 and further precipitates made of silicon and carbon atoms having the gettering action can be formed in the epitaxial film 60. Furthermore, since the film growth can be attained at a temperature higher than that of the conventional technique, it is possible to grow the main silicon epitaxial film 60 having a high quality on the film 40 without deteriorating the quality. At this moment, the size of the precipitates made of silicon and carbon is not particularly limited, and the precipitating site may be in the epitaxial film 60.

The growing method of the gettering epitaxial film 40 is not particularly limited, but may be conducted, for example, by introducing an organic silicon-based gas such as methylsilane gas or the like and a silicon-based gas such as monosilane gas or the like into a furnace within a temperature range of 750-850° C. and simultaneously introducing a gas from a hydrogen gas bomb having an oxygen of a regulated concentration through another pipe into the furnace to grow an epitaxial film containing silicon, carbon and oxygen. On the other hand, within a temperature range of 800-1200° C. are introduced a silicon-based gas such as dichlorosilane or trichlorosilane and an organic gas such as trimethylsilane or the like into the furnace.

Moreover, the growing temperature of the gettering epitaxial film 40 is preferable to be higher than 750° C. but not higher than 1180° C. When the temperature is not higher than 750° C., the epitaxial growth is not proceeding, while when it exceeds 1180° C., there is a fear that impurities included in the silicon substrate 20 mat be diffused into the main silicon epitaxial film 60.

The formation step of the main silicon epitaxial film according to the invention (FIG. 1(e)) is a step of forming the main silicon epitaxial film 60 as a device active layer on the gettering epitaxial film 40 or a capping silicon film 50. The formation method of the main silicon epitaxial film 60 may be a method of forming a silicon film through epitaxial growth. Also, the thickness of the main silicon epitaxial film 60 may be adjusted to various levels depending upon the applications. For example, the thickness of the main silicon epitaxial film 60 may be 2-5 μm in memory devices and 5-30 μm in imaging devices.

Also, it is preferable that a step of growing a capping silicon film 50 (FIG. 1(d)) is conducted between the step of growing the gettering epitaxial film 40 (FIG. 1(c)) and the step of forming the main silicon epitaxial film 60 (FIG. 1(e)). The capping silicon film 50 serves as a cover to the main silicon epitaxial film 60, so that the diffusion of carbon atoms in the gettering epitaxial film 40 into the main silicon epitaxial film 60 can be further suppressed. The formation method of the capping silicon film 50 is not particularly limited, but includes, for example, a formation through a chemical vapor deposition method (CVD), a formation by laminating and the like.

Moreover, it is preferable to conduct a step of forming a silicon epitaxial undercoat 30 by introducing a phosphine gas at a high concentration (FIG. 1(b)) prior to the step of growing the gettering epitaxial film 40 (FIG. 1(c)). In this case, electrons generated from a photodiode can be rapidly escaped from the photodiode portion by the undercoat, so that performances for an imaging device are improved. The formation of the silicon epitaxial undercoat 30 can be carried out, for example, by introducing the phosphine gas or diborane gas at a high concentration in the growth of the gettering epitaxial film 40.

In addition, it is preferable that the silicon substrate 20 is subjected to a heat treatment at about 1100° C. in a hydrogen atmosphere or in a hydrochloric acid gas atmosphere to remove native oxide or particles from the surface of the substrate before the film forming steps (FIGS. 1(c) and (e)). As is known, the efficiency of removing the native oxide or particles from the substrate surface can be enhanced by the high-temperature pretreatment prior to the epitaxial film growth.

Although the above is described with respect to only an embodiment of the invention, various modifications may be made within a scope of the invention.

Example 1

There are provided eight samples (Samples 1-8) of a p-type (100) silicon wafer having a diameter of 200 mm and an initial oxygen concentration of $7.0\times10^{17}$ atoms/cm$^3$ (ASTM F-121, 1979), which is sliced from a silicon ingot grown by CZ method as shown in FIG. 1. Such a silicon wafer is used as an extreme-low oxygen wafer (no formation of oxygen precipitate by IG method) for the purpose of evaluating the gettering performance of a gettering epitaxial film itself. This silicon wafer is a silicon substrate 20 (FIG. 1(a)), which is placed in an epitaxial growth furnace at 800° C. and a temperature of the silicon substrate 20 is raised to 1180° C. with a hydrogen gas and kept for 60 seconds. Subsequently, the temperature is lowered to 800° C., and thereafter monosilane gas is introduced thereinto at a flow rate of 800 cm$^3$/min to form an undercoat 30 having a thickness of 100 nm and further methylsilane gas is introduced at various flow rates so as to form a gettering epitaxial film 40 having a thickness of 100 nm and a carbon atom concentration of a given value per each sample (atoms/cm$^3$) (Sample 1: 0, Sample 2: $5.0\times10^{17}$, Sample 3: $5.0\times10^{19}$, Sample 4: $2.5\times10^{20}$, Sample 5: $6.5\times10^{20}$, Sample 6: $9.0\times10^{20}$, Sample 7: $1.0\times10^{21}$, Sample 8: $1.4\times10^{21}$). Finally, the flow of the methylsilane gas is stopped at 800° C. and only the monosilane gas is flown to form a capping silicon film 50 having a thickness of 50 nm. Then, the temperature is raised to 1100° C. and dichlorosilane gas is introduced to form a main silicon epitaxial film 60 having a thickness of 2 μm, whereby there is obtained an epitaxial wafers 10 for each of Samples 1-8.

Figure 2:
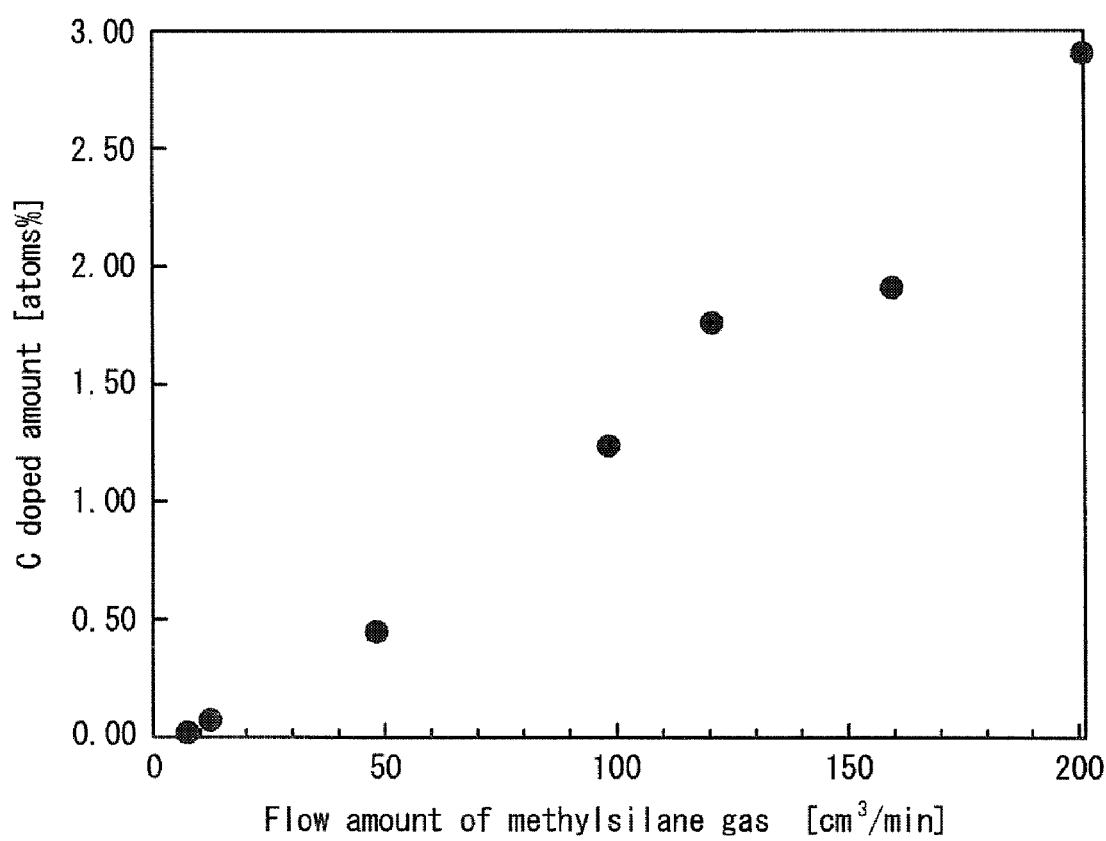
FIG. 2 is a graph showing a carbon doped amount in a gettering epitaxial film of an epitaxial wafer prepared in Example 1.
Figure 3:
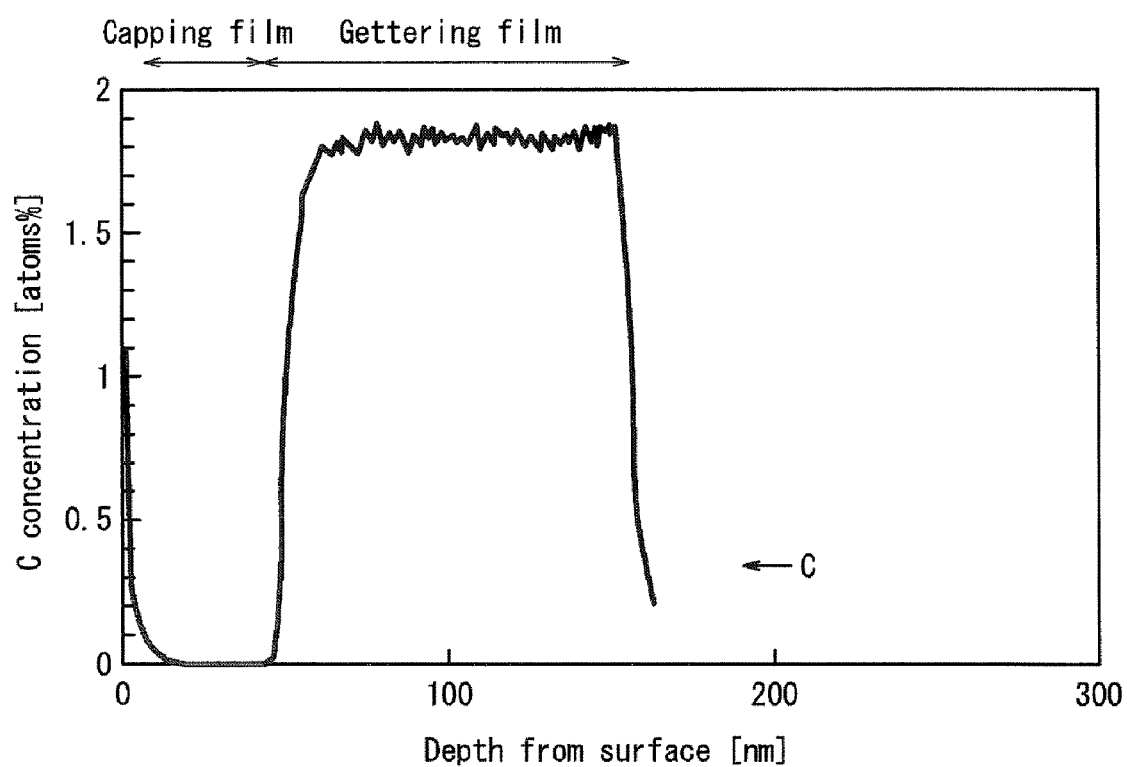
FIG. 3 is a graph showing a carbon concentration from a surface of a capping film in a depth direction of an epitaxial wafer prepared in Example 1.

With respect to the thus obtained samples, a carbon doped amount in the gettering epitaxial film 40 is measured by SIMS measuring machine. A part of the measured results is shown in FIG. 2, from which it can be seen that the carbon doped amount of the gettering epitaxial film 40 increases with the increase of the flow amount of methylsilane gas. On the other hand, FIG. 3 shows a result measured on a carbon concentration from a surface of a capping film in a depth direction by SIMS measurement after the formation of the gettering film 40 and capping film 50 at a flow rate of methylsilane gas of 12 cm$^3$/min, from which it can be seen that the carbon concentration in the gettering film is about 1.8 atom % ($9.0\times10^{20}$ atoms/cm$^3$).

With respect to the samples, LPD having a size of not less than 0.13 μn on the wafer surface is measured by using a particle counter. As a result, the LPD number is not less than 100 in only Sample 8 (carbon concentration: $1.4\times10^{21}$ atoms/cm$^3$) flowing methylsilane gas of 20 cm$^3$/min and not more than about 50 in the other Samples 1-7.

Example 2

Epitaxial wafers 10 of Samples 1-8 are prepared under the same conditions as in Example 1 except that a silicon epitaxial undercoat 30 is grown by introducing phosphine gas at a high concentration at a step of forming a silicon epitaxial undercoat (FIG. 1(b)). As a result of the evaluation on the silicon epitaxial undercoat 30 in the resulting samples, it has been confirmed that the undercoat has a specific resistance of 0.1Ω·cm and a thickness of 100 nm.

With respect to all of the samples, LPD having a size of not less than 0.13 μn on the wafer surface is measured by using a particle counter. As a result, the LPD number is not less than 100 in only Sample 8 (carbon concentration: $1.4\times10^{21}$ atoms/cm$^3$) flowing methylsilane gas of 20 cm$^3$/min and not more than about 50 in the other Samples 1-7.

Example 3

Epitaxial wafers 10 of Samples 1-8 are prepared at the same steps as in Example 1 except that the step of forming the epitaxial undercoat 30 (FIG. 1(b)) is not conducted. It has been confirmed that the carbon doped amount of the gettering epitaxial film is the same as in Example 1 after the measurement.

With respect to all of the samples, LPD having a size of not less than 0.13 μn on the wafer surface is measured by using a particle counter. As a result, the LPD number is not less than 100 in only Sample 8 (carbon concentration: $1.4\times10^{21}$ atoms/cm$^3$) flowing methylsilane gas of 20 cm$^3$/min and not more than about 50 in the other Samples 1-7.

Example 4

Epitaxial wafers 10 of Samples 1-8 are prepared at the same steps as in Example 1 except that the step of forming the capping silicon film 50 (FIG. 1(d)) is not conducted. It has been confirmed that the carbon doped amount of the gettering epitaxial film is the same as in Example 1 after the measurement.

With respect to all of the samples, LPD having a size of not less than 0.13 μn on the wafer surface is measured by using a particle counter. As a result, the LPD number is not less than 100 in only Sample 8 (carbon concentration: $1.4 \times 10^{21}$ atoms/cm$^3$) flowing methylsilane gas of 20 cm$^3$/min and not more than about 50 in the other Samples 1-7.

Example 5

Epitaxial wafers 10 of Samples 1-8 are prepared at the same steps as in Example 1 except that the step of forming the epitaxial undercoat 30 (FIG. 1(b)) and the step of forming the capping silicon film 50 (FIG. 1(d)) are not conducted. It has been confirmed that the carbon doped amount of the gettering epitaxial film is the same as in Example 1 after the measurement.

With respect to all of the samples, LPD having a size of not less than 0.13 μn on the wafer surface is measured by using a particle counter. As a result, the LPD number is not less than 100 in only Sample 8 (carbon concentration: $1.4 \times 10^{21}$ atoms/cm$^3$) flowing methylsilane gas of 20 cm$^3$/min and not more than about 50 in the other Samples 1-7.

Example 6

Epitaxial wafers are prepared under the same conditions as in Example 1 except that the gettering epitaxial film is formed so as to have a carbon concentration of $5.0 \times 10^{19}$ atoms/cm3 and the thickness of this film is changed to 0.001 μm, 0.025 μm, 0.05 μm, 0.1 μm, 0.5 μm, 1 μm and 2 μm, respectively.

Comparative Example 1

A sample of an epitaxial wafer is prepared under the same conditions as in Example 1 except that the step of forming the gettering epitaxial film 40 (FIG. 1(c)) is not conducted. With respect to the thus obtained sample, LPD having a size of not less than 0.13 μn on the wafer surface is measured by using a particle counter, and as a result, the LPD number is not more than 50.

Comparative Example 2

Epitaxial wafers 10 of Samples 1-8 are prepared in the same manner as in Example 1 except that the gettering epitaxial film 40 is grown at 750° C. in the formation step of the gettering epitaxial film (FIG. 1(c)). With respect to all of the samples, LPD having a size of not less than 0.13 μn on the wafer surface is measured by using a particle counter, and as a result, the LPD number in all of Samples 1-8 is not less than 100.

Evaluation Method

With respect to the samples obtained in Example and Comparative Example are evaluated the following evaluation items (1) and (2).

(1) Evaluation 1 of Gettering Ability (Determination of Carbon Concentration)

With respect to the samples obtained in Examples 1, 3 and 5 and Comparative Examples 1 and 2, surface contamination with a nickel concentration of $1 \times 10^{12}$ atoms/cm$^2$ is carried out by using a spin coat contamination method. After the sample is further subjected to a heat treatment at 1000° C. for 1 hour, a selective etching (with a wright ET solution) is conducted to evaluate a surface defect density of the sample. The evaluation results are shown in Table 1.

○: not more than 1000 atoms/cm$^2$
Δ: more than 1000 atoms/cm$^2$ but not more than 10000 atoms/cm$^2$
X: more than 10000 atoms/cm$^2$ (2) Evaluation 2 of Gettering Ability (Determination of Gettering Thickness)

With respect to the sample obtained in Example 6, surface contamination with a nickel concentration of $1 \times 10^{12}$ atoms/cm$^2$ is carried out by using a spin coat contamination method. After the sample is further subjected to a heat treatment at 1000° C. for 1 hour, a selective etching (with a wright ET solution) is conducted to evaluate a surface defect density of the sample. The evaluation result is shown in Table 2.

TABLE 1

| | Gettering epitaxial film | Capping silicon film | Silicon epitaxial undercoat | Surface defect density | | | | | | | |
|---|---|---|---|---|---|---|---|---|---|---|---|
| | | | | Sample 1 | Sample 2 | Sample 3 | Sample 4 | Sample 5 | Sample 6 | Sample 7 | Sample 8 |
| Example 1 | presence | presence | presence | — | ○ | ○ | ○ | ○ | ○ | ○ | ○ |
| Example 3 | presence | presence | none | — | ○ | ○ | ○ | ○ | ○ | ○ | ○ |
| Example 4 | presence | none | presence | — | ○ | ○ | ○ | ○ | ○ | ○ | ○ |
| Example 5 | presence | none | none | — | ○ | ○ | ○ | ○ | ○ | ○ | ○ |
| Comparative Example 1 | none | presence | presence | X | — | — | — | — | — | — | — |
| Comparative Example 2 | presence | presence | presence | — | ○ | ○ | ○ | ○ | ○ | ○ | ○ |

TABLE 2

| | Gettering epitaxial film | Capping silicon film | Silicon epitaxial undercoat | Surface defect density Thickness of gettering epitaxial film (μm) | | | | | |
|---|---|---|---|---|---|---|---|---|---|
| | | | | 0.001 | 0.025 | 0.1 | 0.5 | 1 | 2 |
| Example 6 | presence | presence | presence | X | ○ | ○ | ○ | ○ | ○ |

(3) LPD Evaluation of Final Epitaxial Grown Film

With respect to the samples of Examples and Comparative Examples is measured LPD number. The results are shown in Table 3.

○: The number of LPD having a size of not less than 0.13 μm in the wafer is not more than 50.

X: The number of LPD having a size of not less than 0.13 μm in the wafer is not less than 50.

TABLE 3

| | Gettering epitaxial film | Capping silicon film | Silicon epitaxial undercoat | LPD Sample 1 | Sample 2 | Sample 3 | Sample 4 | Sample 5 | Sample 6 | Sample 7 | Sample 8 |
|---|---|---|---|---|---|---|---|---|---|---|---|
| Example 1 | presence | presence | presence | ○ | ○ | ○ | ○ | ○ | ○ | ○ | X |
| Example 3 | presence | presence | none | ○ | ○ | ○ | ○ | ○ | ○ | ○ | X |
| Example 4 | presence | none | presence | ○ | ○ | ○ | ○ | ○ | ○ | ○ | X |
| Example 5 | presence | none | none | ○ | ○ | ○ | ○ | ○ | ○ | ○ | X |
| Comparative Example 1 | none | presence | presence | ○ | — | — | — | — | — | — | — |
| Comparative Example 2 | presence | presence | presence | X | X | X | X | X | X | X | X |

As seen from the results of Table 1, all of the example samples have a good gettering effect. Furthermore, as seen from the results of Table 2, the sample of Example 6 is good in the surface defect density except for the gettering thickness of 0.001 μm.

On the other hand, the sample of Comparative Example 2 has a gettering effect equal to those of the example samples, but the LPD number thereof is larger than those of the example samples as seen from the results of Table 3. Therefore, as the actual LPD is further observed by means of an atomic force microscope, LPD in the example samples is particles on the epitaxial surface, while a greater part of LPD in the sample of Comparative Example 2 is a pit-like defect or an epitaxial defect called as stacking fault, which causes the deterioration of the device characteristics. From this fact, it is understood that the sample of Comparative Example 2 is poor in the crystallinity as compared with the example samples. This is considered due to the fact that although the epitaxial growth at 1100° C. is carried out at the formation step of the main silicon epitaxial film 60 in Comparative Example 2, since the temperature in the growth of the gettering epitaxial film 40 is 750° C., the crystallinity is bad and the quality of the crystal is not improved even in the further epitaxial growth at 1100° C.

According to the invention, even when the gettering layer is formed in the vicinity of the device active layer, there can be provided an epitaxial wafer having a gettering layer with a high gettering ability without adversely affecting the quality of the device active layer.

What is claimed is:

1. A method of producing an epitaxial wafer, comprising:
   growing a gettering epitaxial film containing silicon and carbon on a silicon substrate in a mixed gas atmosphere containing silicon and carbon at a temperature of higher than 750° C.;
   forming a main silicon epitaxial film on the gettering epitaxial film, in which a carbon atom concentration in the gettering epitaxial film is made to not less than $5.0 \times 10^{17}$ atoms/cm$^3$ but not more than $1.0 \times 10^{21}$ atoms/cm$^3$ and carbon atoms are existent between silicon lattices; and
   growing a capping silicon film between the growing of the gettering epitaxial film and the growing of the main silicon epitaxial film.

2. A method of producing an epitaxial wafer according to claim 1, wherein the gettering epitaxial film has a thickness of 0.025-5 μm.

3. A method of producing an epitaxial wafer according to claim 1, which further comprises a growing a silicon epitaxial undercoat prior to the growing of the gettering epitaxial film.

4. A method of producing an epitaxial wafer according to claim 3, wherein at least one of the silicon epitaxial undercoat, the gettering epitaxial film and the capping silicon film is a low resistance film having a specific resistance of not more than 1Ω·cm.

5. A method of producing an epitaxial wafer according to claim 1, wherein the temperature is less than 1180° C.

6. A method of producing an epitaxial wafer according to claim 1, wherein the capping silicon film comprises a low resistance film having a specific resistance of not more than 1Ω·cm.

7. A method for producing an epitaxial wafer according to claim 1, wherein the capping silicon film suppresses diffusion of carbon atoms from the gettering epitaxial film into the main silicon epitaxial film.

8. A method of producing an epitaxial wafer according to claim 1, wherein the capping silicon film is an undoped silicon film.

* * * * *